(12) United States Patent
Chaudhry et al.

(10) Patent No.: US 6,639,298 B2
(45) Date of Patent: Oct. 28, 2003

(54) MULTI-LAYER INDUCTOR FORMED IN A SEMICONDUCTOR SUBSTRATE

(75) Inventors: Samir Chaudhry, Orlando, FL (US); Paul Arthur Layman, Orlando, FL (US); J. Ross Thomson, Clermont, FL (US); Mohamed Laradji, St. Cloud, FL (US); Michelle D. Griglione, Orlando, FL (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 09/972,482

(22) Filed: Oct. 5, 2001

(65) Prior Publication Data

US 2003/0001231 A1 Jan. 2, 2003

Related U.S. Application Data

(60) Provisional application No. 60/301,285, filed on Jun. 28, 2001.

(51) Int. Cl.[7] .................................. H01L 23/52
(52) U.S. Cl. ......................... 257/531; 257/758
(58) Field of Search ..................... 257/531, 758

(56) References Cited

U.S. PATENT DOCUMENTS

| | | | |
|---|---|---|---|
| 4,313,152 A | 1/1982 | Vranken | |
| 5,095,357 A | 3/1992 | Andoh et al. | |
| 5,157,576 A | 10/1992 | Takaya et al. | |
| 5,227,659 A | 7/1993 | Hubbard | |
| 5,372,967 A | 12/1994 | Sundaram et al. | |
| 5,446,311 A | * 8/1995 | Ewen et al. | 257/508 |
| 5,541,442 A | 7/1996 | Keil et al. | |
| 5,559,360 A | 9/1996 | Chiu et al. | |
| 5,610,433 A | 3/1997 | Merrill et al. | |
| 5,717,243 A | 2/1998 | Lowther | |
| 5,736,749 A | 4/1998 | Xie | |
| 5,863,806 A | 1/1999 | Lue | |
| 6,008,102 A | 12/1999 | Alford et al. | |

(List continued on next page.)

FOREIGN PATENT DOCUMENTS

| | | | |
|---|---|---|---|
| EP | 0 725 407 A1 | 8/1996 | |
| GB | 1 279 160 | 9/1969 | |
| JP | 11354330 A | * 12/1999 | ........... H01F/21/08 |
| WO | WO 02/13271 A2 | 2/2002 | |

OTHER PUBLICATIONS

Niknejad, Ali M. and Meyer, Robert G.; "Design, Simulation and Applications of Inductors and Transformers for Si RF ICs"; Kluwer Academic Publishers, Boston/Dordrecht/London; pp. 22–31. 2000.

*Primary Examiner*—Allan R. Wilson
(74) *Attorney, Agent, or Firm*—John L. DeAngelis, Jr.; Beusse Brownlee Bowdoin & Wolter, P.A.

(57) ABSTRACT

A thin-film multi-layer high Q inductor spanning at least three metal layers is formed by forming a plurality of parallel first metal runners on the semiconductor substrate. A plurality of first and second vertical conductive vias are formed in electrical communications with each end of the plurality of metal runners. A plurality of third and fourth conductive vias are formed over the plurality of first and second conductive vias and a plurality of second metal runners are formed interconnecting the plurality of third and fourth conductive vias. The plurality of first metal runners are in a different vertical than the plurality of second metal runners such that the planes intersect. Thus one end of a first metal runner is connected to an overlying end of a second metal runner by way of the first and third vertical conductive vias. The other end of the second metal runner is connected to the next metal one runner by way of the second and fourth vertical conductive vias., forming a continuously conductive structure having a generally helical shape.

2 Claims, 7 Drawing Sheets

U.S. PATENT DOCUMENTS

| | | |
|---|---|---|
| 6,015,742 A | 1/2000 | Ju |
| 6,031,445 A * | 2/2000 | Marty et al. ............... 336/200 |
| 6,037,649 A | 3/2000 | Liou |
| 6,057,202 A | 5/2000 | Chen et al. |
| 6,083,802 A | 7/2000 | Wen et al. |
| 6,124,624 A | 9/2000 | Van Roosmalen et al. |
| 6,140,197 A | 10/2000 | Chu et al. |
| 6,160,303 A | 12/2000 | Fattaruso |
| 6,166,422 A | 12/2000 | Qian et al. |
| 6,187,647 B1 | 2/2001 | Chu |
| 6,240,622 B1 | 6/2001 | Ahn et al. |
| 6,249,191 B1 | 6/2001 | Forbes |
| 6,255,714 B1 | 7/2001 | Kossives et al. |
| 6,420,773 B1 * | 7/2002 | Liou ......................... 257/531 |
| 6,429,504 B1 * | 8/2002 | Beaussart et al. ........... 257/531 |

* cited by examiner

MULTI-LAYER INDUCTOR FORMED IN A SEMICONDUCTOR SUBSTRATE

This patent application claims priority to the provisional patent application filed on Jun. 28, 2001, and assigned Ser. No. 60/301,285.

FIELD OF THE INVENTION

This invention relates generally to inductors formed on an integrated circuit substrate, and more specifically to inductors having a core spanning at least three metal layers of the integrated circuit.

BACKGROUND OF THE INVENTION

The current revolution in wireless communications and the need for smaller wireless communications devices has spawned significant efforts directed to the optimization and miniaturization of radio communications electronics devices. Passive components of these devices (such as inductors, capacitors and transformers), play a necessary role in the devices' operation and thus efforts are directed toward reducing the size and improving the fabrication efficiency of such components.

Inductors, which play an integral role in the performance of electronic communications devices, are electromagnetic components comprising a plurality of windings typically enclosing a core constructed of either magnetic material or an insulator. Use of a magnetic core yields higher inductance values. The inductance is also substantially affected by the number of coil turns; specifically, the inductance is proportional to the square of the number of turns. The inductance value is also affected by the radius of the core and other physical factors. Conventional inductors are formed as a helix (also referred to as a solenoidal shape) or a torroid.

With the continual allocation of operational communications frequencies into higher frequency bands, inductor losses increase due to increased eddy current and skin effect losses. For use in devices operating at relatively low frequency, inductors can be simulated by employing certain active devices. But simulated inductors are more difficult to realize at higher frequencies, have a finite dynamic range and inject additional and unwanted noise into the operating circuits.

The Q (or quality factor) is an important inductor figure of merit. The Q measures the ratio of inductive reactance to inductive resistance. High Q inductors present a narrow peak when the inductor current is graphed as a function of the input signal frequency, with the peak representing the frequency at which the inductor resonates. High Q inductors are especially important for use in frequency-dependent circuits operating with narrow bandwidths. Because the Q value is an inverse function of inductor resistance, it is especially important to minimize the resistance to increase the Q.

Most personal communications devices incorporate integrated circuit active components fabricated using semiconductor technologies, such as silicon or gallium-arsenide. The prior art teaches certain integrated planar inductors (including torroidal or spiral shapes) developed to achieve compatibility with the silicon-based integrated circuit fabrication processes. However, such planar inductors tend to suffer from high losses and low Q factors at the operative frequencies of interest. These losses and low Q factors are generally attributable to dielectric losses caused by parasitic capacitances and resistive losses due to the use of thin and relatively high resistivity conductors. Another disadvantage of conventional planar inductors is due to the magnetic field lines perpendicular to the semiconductor substrate surface. These closed-loop magnetic field lines enter the material above, beside and below the inductor. Penetration of the dielectric materials increase the inductive losses and lowers the inductor's Q factor. Also, unless the inductor is located at a significant distance from the underlying active circuit elements formed in the silicon, the inductor magnetic fields induce currents in and therefore disrupt operation of the underlying active components.

With integrated circuit active devices growing smaller and operating at higher speeds, the interconnect system should not add processing delays to the device signals. Use of conventional aluminum interconnect metallization restricts circuit operational speed as the longer interconnects and smaller interconnect cross-sections increase the interconnect resistance. Also, the relatively small contact resistance between the aluminum and silicon surfaces creates a significant total resistance as the number of circuit components grows. It is also difficult to deposit aluminum with a high aspect ratio in vias and plugs, where the aspect ratio is defined as the ratio of plug thickness to diameter.

Given theses disadvantages, copper is becoming the interconnect of choice because it is a better conductor than aluminum (with a resistance of 1.7 micro-ohm cm compared to 3.1 micro-ohm cm for aluminum), is less susceptible to electromigration, can be deposited at lower temperatures (thereby avoiding deleterious effects on the device dopant profiles) and is suitable for use as a plug material in a high aspect ration plug. Copper interconnects can be formed by chemical vapor deposition, sputtering, electroplating and electrolytic plating.

The damascene process is one technique for forming active device copper interconnects. A trench is formed in a surface dielectric layer and the copper material is then deposited therein. Usually the trench is overfilled, requiring a chemical and mechanical polishing step to re-planarize the surface. This process offers superior dimensional control because it eliminates the dimensional variations introduced in a typical pattern and etch interconnect process. The dual damascene process extends the damascene process, simultaneously forming both the underlying vias and the interconnecting trenches from copper. First the plug via and then the metal trench is formed. A subsequent metal deposition step fills both the via and the trench, forming a complete metal layer. A chemical and mechanical polishing step planarizes the top surface or the substrate.

U.S. Pat. No. 6,008,102 describes one process for forming a three-dimensional or helical inductor using copper layers formed by conventional and multiple patterning, etching and deposition steps. The multiple interconnecting vias are formed and filled with metal in separate steps from the formation and filling of the trenches.

BRIEF SUMMARY OF THE INVENTION

To provide further advances in the fabrication of inductors in conjunction with active devices on a semiconductor substrate, an architecture and processes is provided for forming such an inductor within the conventional metal layers of an integrated circuit, wherein the inductor core area is larger than prior art inductors, resulting in a higher inductance value and a higher Q figure of merit. Also, an inductor formed according to the teachings of the present inventions has a desirable low-resistance (and thus high Q) in a relatively compact area of the integrated circuit. One technique for forming such an inductor is a dual damascene process.

According to one embodiment of the invention, a plurality of parallel lower conductive strips are formed overlying the semiconductor substrate, in which active components were previously formed. First and second vertical conductive via openings are formed over first and second opposing edges of each lower conductive strip and conductive material is deposited within the via openings to form first and second conductive vias. Two additional via openings are formed in vertical alignment with the first and the second conductive vias and filled with metal to form third and fourth conductive vias. A plurality of upper conductive strips are then formed, wherein the plane of an upper conductive strip intersects the plane of a lower conductive strip such that a first edge of one upper conductive strip overlies the first edge of a lower conductive strip, and the two edges are interconnected by the first and the third conductive vias. A second edge of the upper conductive strip overlies the second edge of the next parallel lower conductive strip, and these edges are electrically connected by the second and the fourth conductive vias. Thus the inductor comprises a helix of individual windings.

According to another embodiment of the invention, a plurality of parallel lower damascene trenches or windows are formed in a first multi-layer stack of dielectric layers overlying the existing substrate. The trenches are filled with copper. Two vertical conductive vias are formed in electrical communication with each edge of each lower damascene trench and copper is deposited therein. Next, according to a dual damascene process, an additional plurality of vias and upper trenches are formed in a second multi-layer stack of insulating layers overlying the first stack. The vertical plane of the lower damascene trench intersects the vertical plane of the upper damascene trench. A pair of vias associated with each one of the upper trenches is vertically aligned with the previously formed vias connected to the lower trench. The additional plurality of vias and upper trenches are filled with copper, preferably by electroplating and the surface then undergoes a chemical and mechanical polishing step. Because the planes of the lower and upper damascene trenches intersect, a helical succession of lower and upper damascene trenches interconnected by the conductive vias is formed.

BRIEF DESCRIPTION OF THE DRAWINGS

The present invention can be more easily understood and the further advantages and uses thereof more readily apparent, when considered in view of the detailed description of the invention and the following figures in which.

In accordance with common practice, the various described device features are not drawn to scale, but are drawn to emphasize specific features relevant to the invention. Reference characters denote like elements throughout the figures and text.

DETAILED DESCRIPTION OF THE INVENTION

Figure 1:
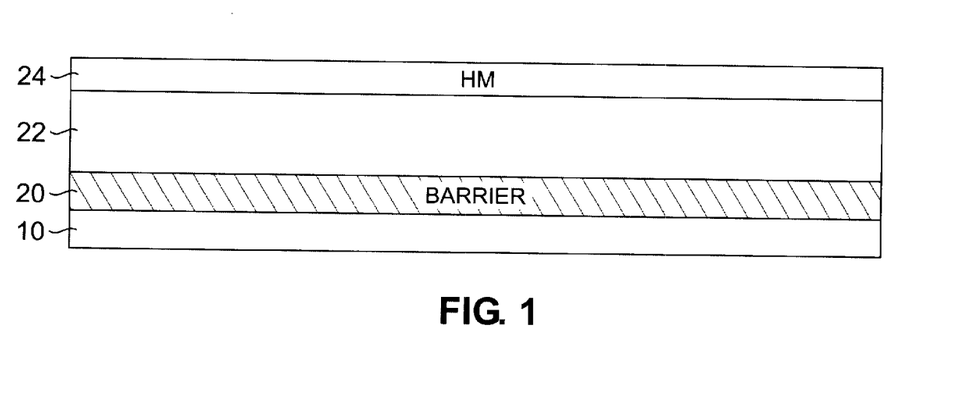
FIGS. 1 through 9 illustrate, in cross-section, an inductor structure according to one fabrication embodiment of the present invention during sequential fabrication steps.

One process for forming an inductor according to the present invention begins as shown in FIG. 1, where a plurality of insulating layers are formed over an existing integrated circuit substrate 10, which conventionally includes a plurality of active elements. Typically, at this point in the conventional fabrication process, no metal interconnect layers have been formed for the active device; only the vias or windows for gaining access to the active device regions have been formed. A barrier layer 20 overlies the surface of the semiconductor substrate 10 and is preferably formed of tantalum, tantalum-nitride, titanium or titanium-nitride. Next an insulating layer 22, preferably one formed from a relatively low dielectric constant material is formed over the barrier layer 20. Low dielectric silicon dioxide, black diamond and coral are suitable candidates for the insulating layer 22. The relative dielectric constant for silicon dioxide is about 3.9. This a low relative dielectric constant is generally considered to be less than about 3.0. The low dielectric constant material reduces inter-layer capacitance and therefore potential cross-talk between signals, although in another embodiment conventional silicon dioxide can be used. The barrier layer 20 and the insulating layer 22 can be formed by chemical vapor deposition.

Figure 2:
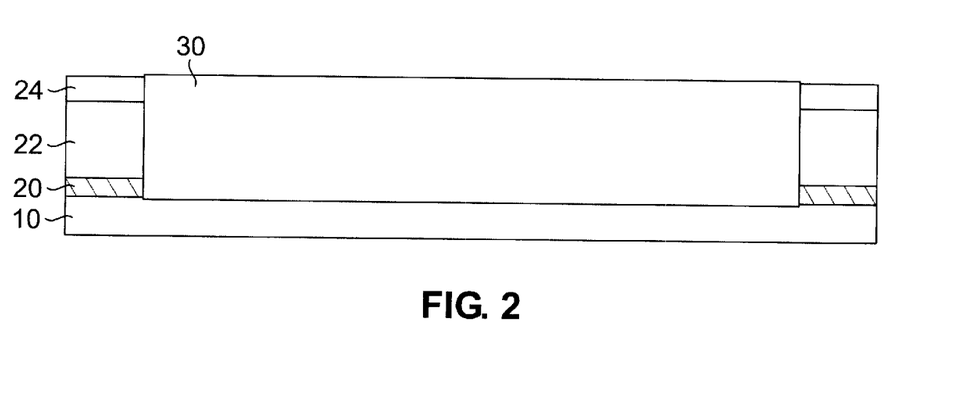

A layer 24 overlying the insulating layer 22 comprises a hard mask of silicon dioxide. To etch a layer or layers below a hard mask, photoresist material is applied over the hard mask, the photoresist is patterned and then the pattern is transferred from the photoresist to the hard mask. The photoresist is removed and the etching steps are carried out using the hard mask pattern. This process advantageously offers better dimensional control of the etched features. In lieu of a hard mask, conventional photo resist patterning and etching steps can be utilized. In either case, as shown in FIG. 2, a window or trench 30 is formed in the insulating layer 22 and the hard mask layer 24, by the use of suitable etchants. The exposed region of the barrier layer 20 at the bottom of the trench 30 is then removed by etching In the top view, the trench 30 is circular or elliptical. Generally, patterning and etching steps do not allow formation of sharp-cornered structural shapes, and thus windows and trenches, when viewed from the top, are typically circular, elliptical, or have relatively straight edges and rounded corners between the edges.

Figure 3:
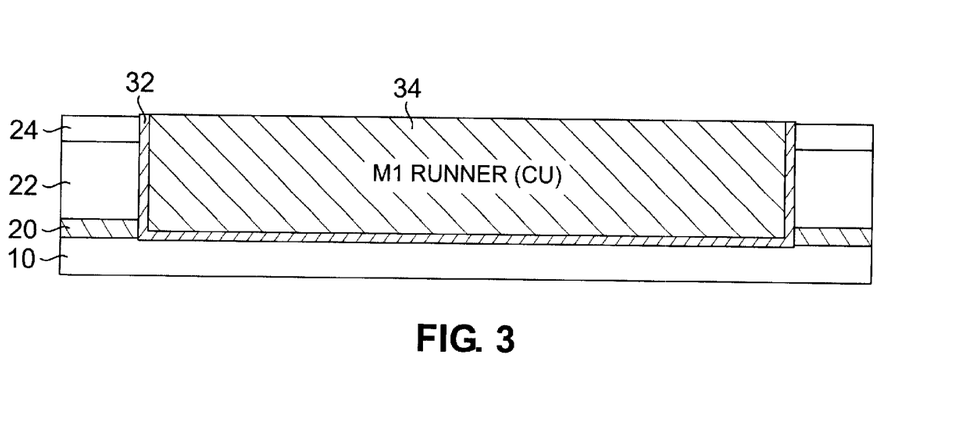

Turning to FIG. 3, a barrier and seed layer 32 is deposited. Typically, this is accomplished in two steps. First a barrier material is sputtered into the trench 30. Tantalum, tantalum-nitride, titanium and titanium-nitride are candidate materials for the barrier layer. Next, a thin copper seed layer is deposited, preferably by sputtering. The seed layer is required as a starting layer for the electroplated copper. Both the barrier material and the seed material of the barrier and seed layer 32 can also be deposited by conventional chemical vapor deposition and electroplating processes. A metal-1 runner layer 34 is now formed, preferably by electroplating copper. Electroplating is especially advantageous because it can be performed at a low temperature and at a relatively low cost. The low temperature deposition feature is advantageous as it avoids changes in the dopant profiles in active regions of the semiconductor substrate. The substrate is then chemically-mechanically polished to remove the electroplated copper from all regions except within the metal-1 runner 34. This process for depositing copper layers in the insulating layers is known as the damascene process. It offers superior dimensional control because it eliminates the variations introduced in a conventional metal pattern and etch process where the vias and the interconnects are formed in two separate steps. Additional details of the damascene and dual damascene process are discussed in the following references, which are hereby incorporated by reference: C. K. Hu et. al., Proceedings MRS Symposium on VLSI, vol.

5, p. 369 (1990); B. Luther et. al., Proceedings VMIC, vol. 10, p. 15 (1994); D. Edelstein, Proceedings ECS Mtg., vol. 96–2, p. 335 (1996).

In certain circuit configurations it may be necessary to connect the metal-1 runner 34 to underlying active device regions in the substrate. For instance one end of the metal-1 runner serves as an inductor terminal for connection to another component in the circuit. This can be accomplished by a dual damascene process by first forming a via opening for connecting one end of the metal-1 runner to an underlying device region. The second step forms the window 30, and the third step simultaneously fills the via opening and the trench 30 to form a conductive via and the metal-1 runner 34. By this technique, the metal-1 runner 34 is connected to the underlying device region. The conductive via can also be formed by conventional processes and then the metal-1 runner 34 formed in electrical contact therewith.

Figure 4:
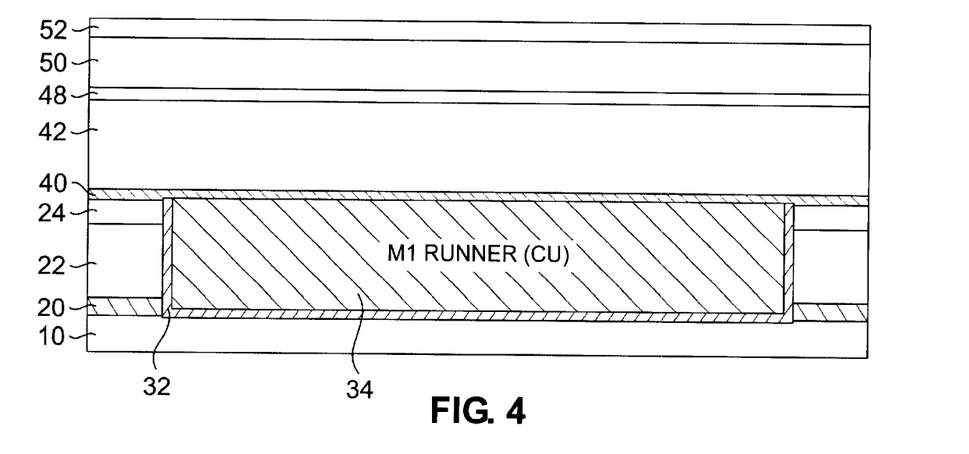

As shown in FIG. 4, a four-layer stack is now formed over the metal-1 runner 34 and the adjacent regions of the layers 20, 22 and 24. First a barrier layer 40 (preferably of titanium-nitride) is deposited as shown. An insulating layer 42 preferably having a relatively low dielectric constant is formed over the barrier layer 40 and comprises low dielectric constant silicon-dioxide, black diamond or coral. The use of a low dielectric constant material is advantageous to reduce inter-layer capacitance and thus inter-layer cross-talk, but it is not required that the insulating layer 42 comprise a low-dielectric material. An etch stop layer 48, formed of, for example, silicon-nitride, is formed over the insulating layer 42. Another insulating layer 50, preferably having a low dielectric constant, is formed over the etch stop layer 48. A hard mask layer 52 is formed over the insulating layer 50. As discussed above, conventional photoresist and masking material can be used in lieu of the hard-mask layer 52.

Figure 5:
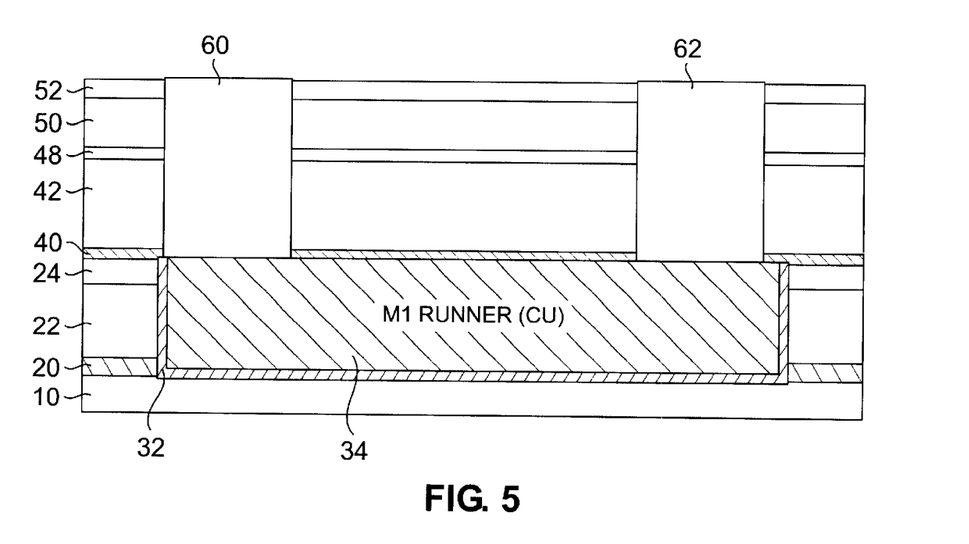
Figure 10:
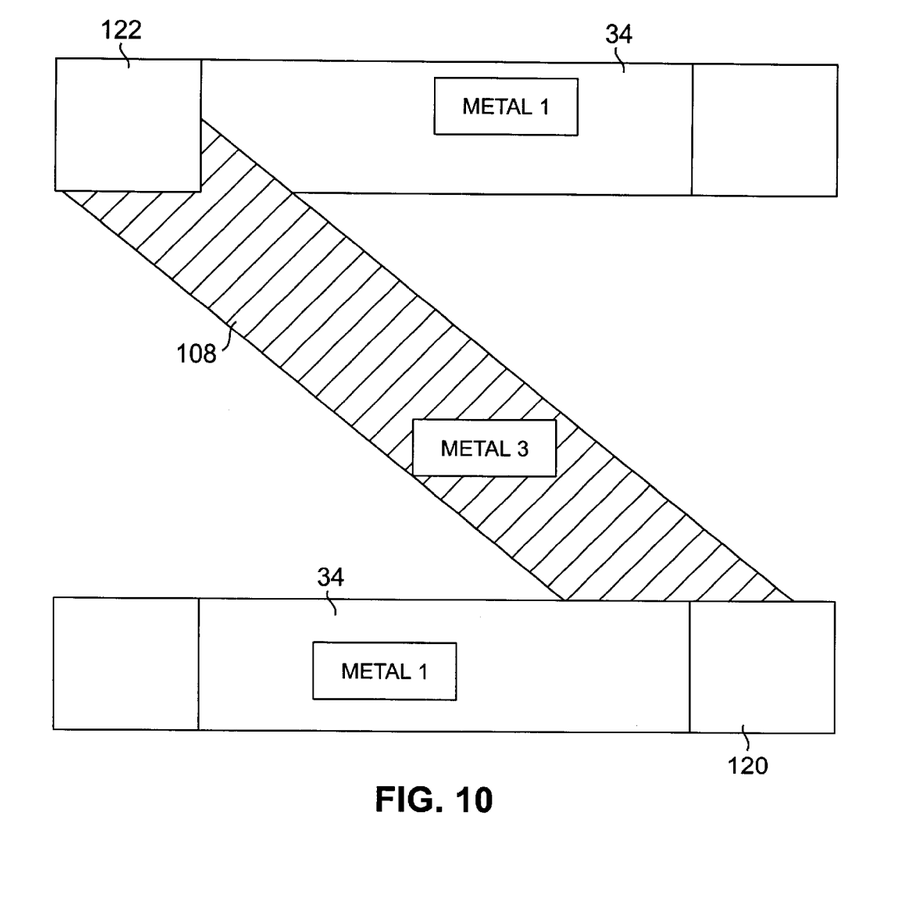
FIGS. 10 through 12 illustrate top views of alternative inductor structures formed according to the teachings of the present invention.

Turning to FIG. 5, a masking step employing the hard mask layer 52 defines the areas where via openings 60 and 62 are formed, extending downwardly to the barrier layer 40. The regions of the barrier layer 40 exposed through the via openings 60 and 62 are removed by etching. At this point in the fabrication process there are likely other areas of the integrated circuit that require metal-2 layer interconnects with underlying device regions, and thus the via openings for those interconnects are patterned and etched when the vias openings 60 and 62 are formed. It should be noted at this point that the metal-1 runner 34 as shown in FIG. 5 can be oriented parallel to the front surface of the semiconductor substrate (although this is not necessarily required), and thus the via opening 60 (and all the elements constructed above it as will be discussed below) and the via opening 62 (and all the elements formed above it) are in the same vertical plane. See FIG. 10.

Figure 6:
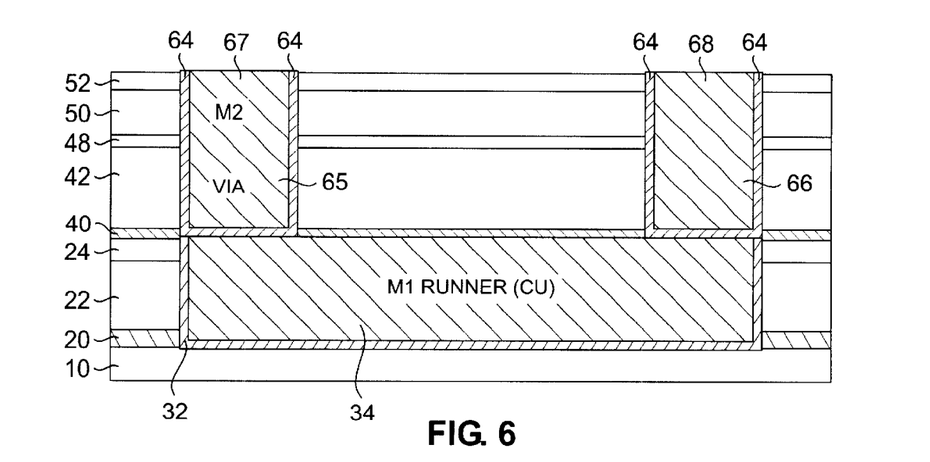

As illustrated in FIG. 6, a barrier and seed layer 64 is deposited within the via openings 60 and 62. The process and materials are identical to those discussed in conjunction with the barrier and seed layer 32 of FIG. 3. Copper is then preferably electroplated within the via openings 60 and 62, followed by a chemical and mechanical polishing step to planarize the top surface. At this point, the copper regions in the lower portion of the via openings 60 and 62 are referred to as conductive vias 65 and 66. The copper material in the upper regions of the via openings 60 and 62 is referred to as metal-2 via layers 67 and 68.

Figure 7:
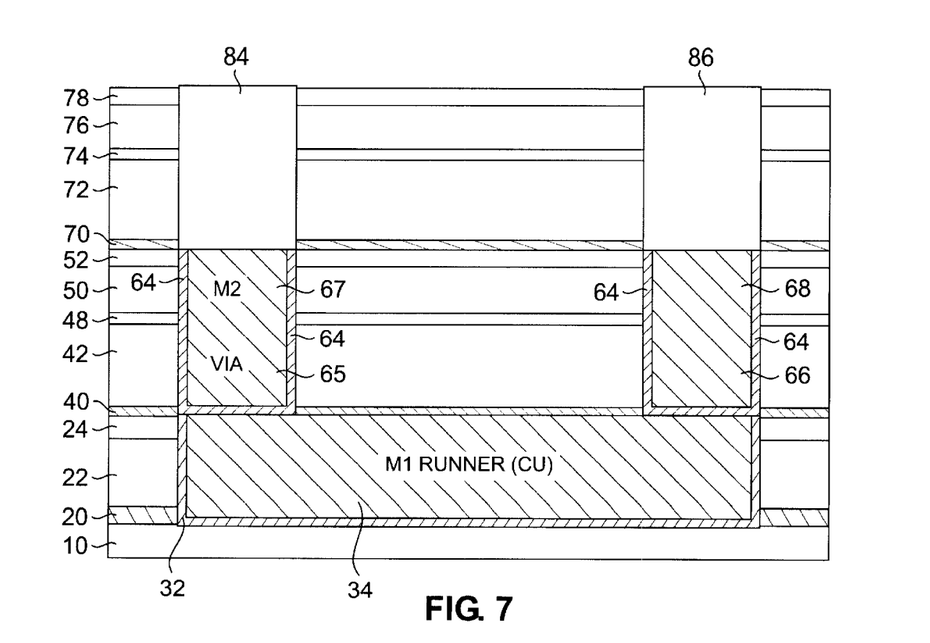
Figure 8:
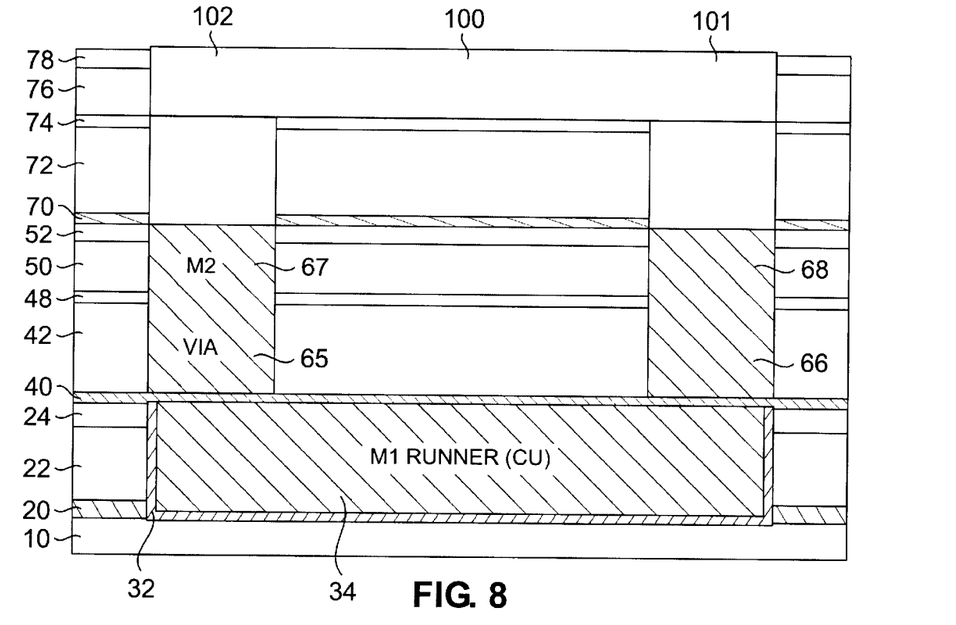

As shown in FIG. 7, a multi-layer stack is formed over the existing layers, where the material of the individual layers is preferably identical to the materials used in the multi-layer stack discussed in conjunction with FIG. 4. In particular, the layers formed sequentially include a barrier layer 70, an insulating layer 72 (preferably comprising material having a low dielectric constant), an etch stop layer 74, an insulating layer 76 (again preferably comprising a low dielectric constant material), and a hard mask layer 78. Via openings 84 and 86 are formed therein, using the hard mask layer 78 to pattern and etch the surface. The exposed regions of the barrier layer 70 within the via openings 84 and 86 are removed. At this point the top surface of the metal-2 via layers 67 and 68 are aligned with, respectively, the via openings 84 and 86. Next a trench 100 is formed in the substrate as illustrated in FIG. 8. The trench 100 extends downwardly to the etch stop layer 74. In a preferred embodiment, to effectively stop the etch process at the etch stop layer 74, the etching process is monitored to analyze the byproducts that are etched from the material. In this case, when the material of the etch stop 74 is detected, the etch process is terminated. As a result, the trench 100 extends downwardly only to the etch stop layer 74. It should be noted that the trench 100 is not in the same plane as the metal-1 runner 34. Instead, an end 101 of the trench 100 is in the foreground of FIG. 8 and an end 102 is in the background. This orientation is clearly shown in the FIG. 10 top view. Thus it will be seen that the conductive material formed later in the trench 100, as described below, will interconnect two successive metal-1 runners.

Figure 9:
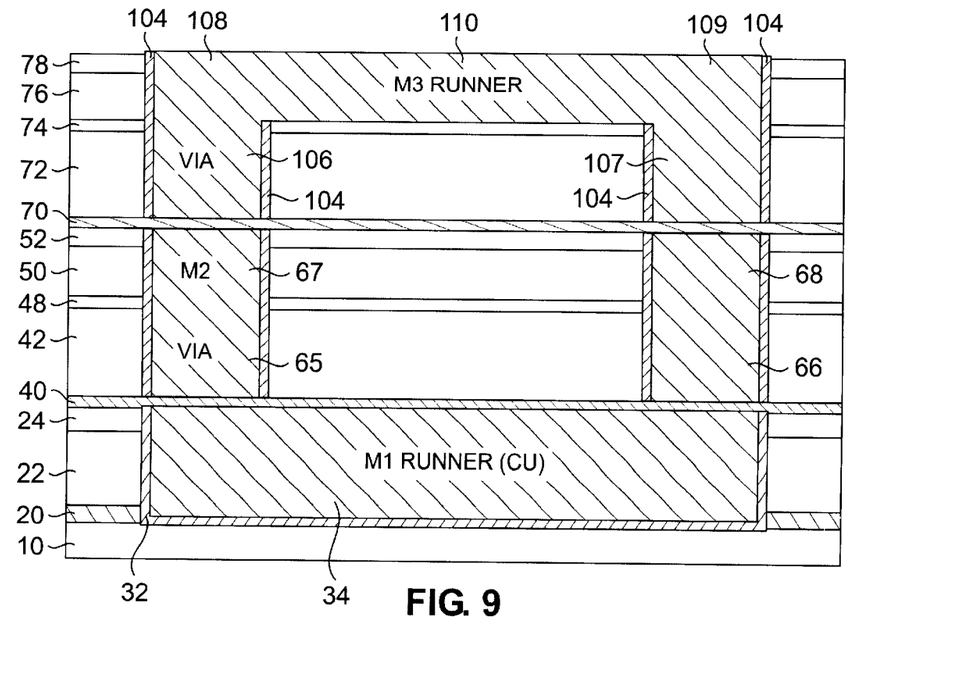

As shown in FIG. 9, a barrier and seed layer 104 is deposited to limit the diffusion of the copper into the insulating layers and to provide a seed material for the subsequent copper electroplating process. It is not necessary to form a barrier layer along the bottom surface of the trench 100, as the etch stop layer 74 serves the barrier purpose, and the plating seed layer is not required because copper will electroplate laterally from the sidewalls of the third level vias 84 and 86. Copper is then deposited, or preferably electroplated, as illustrated in FIG. 9, filling the via openings 84 and 86 to form conductive vias 106 and 107, metal-3 via layer 108 and 109 and a metal-3 runner 110 therebetween. The structure is then chemically-mechanically polished to remove copper from the unwanted areas and planarize the top surface.

Figure 11:
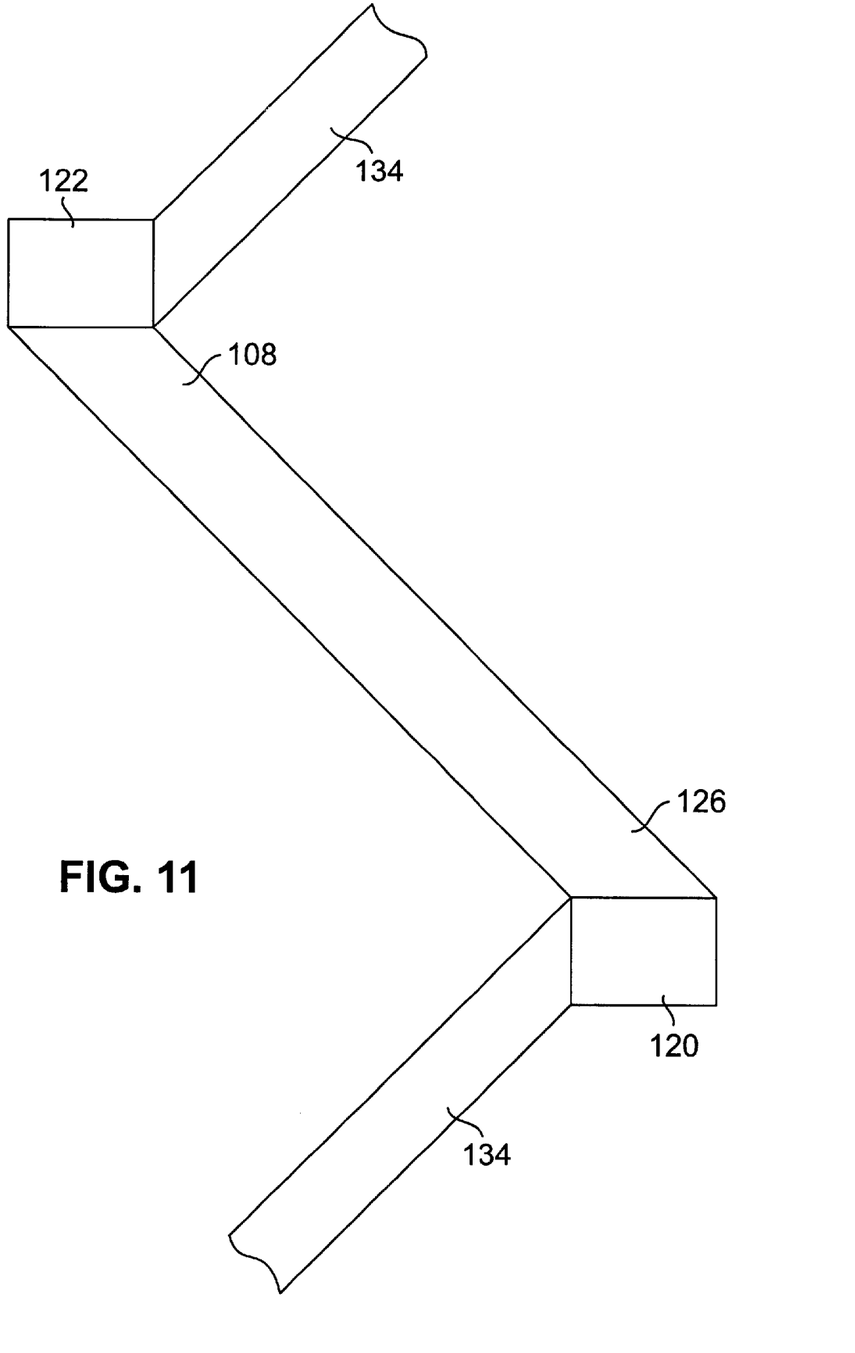

As discussed above, the metal-3 runner 108 is not in the same vertical plane as the metal-1 runner 34. Further, there are a plurality of parallel-oriented metal-1 runners 34 and metal-3 runners 110, interconnected as shown in the top view of FIG. 10, where the interconnected structure forms a Z-shaped structure. In this embodiment, the metal-1 runner 34 is I-shaped and from above, the combination of the metal-1 and metal-3 runners 34 and 108, resembles the letter "Z". Thus the metal-3 runner 108 serves as an interconnecting structure connecting successive metal-1 runners 34 via the vertical conductive stacks 120 (comprising the conductive via 66, the metal-2 via layer 68, the conductive via 107 and the metal-3 via layer 109) and the vertical conductive stack 122 (comprising the conductive via 65, the metal-2 via layer 67, the conductive via 106 and the metal-3 via layer 108). In yet another embodiment, the metal-1 and metal-3 runners 34 and 108 are interconnected in an alternating zig-zag pattern to form a continuously conductive structure. See FIG. 11.

Figure 12:
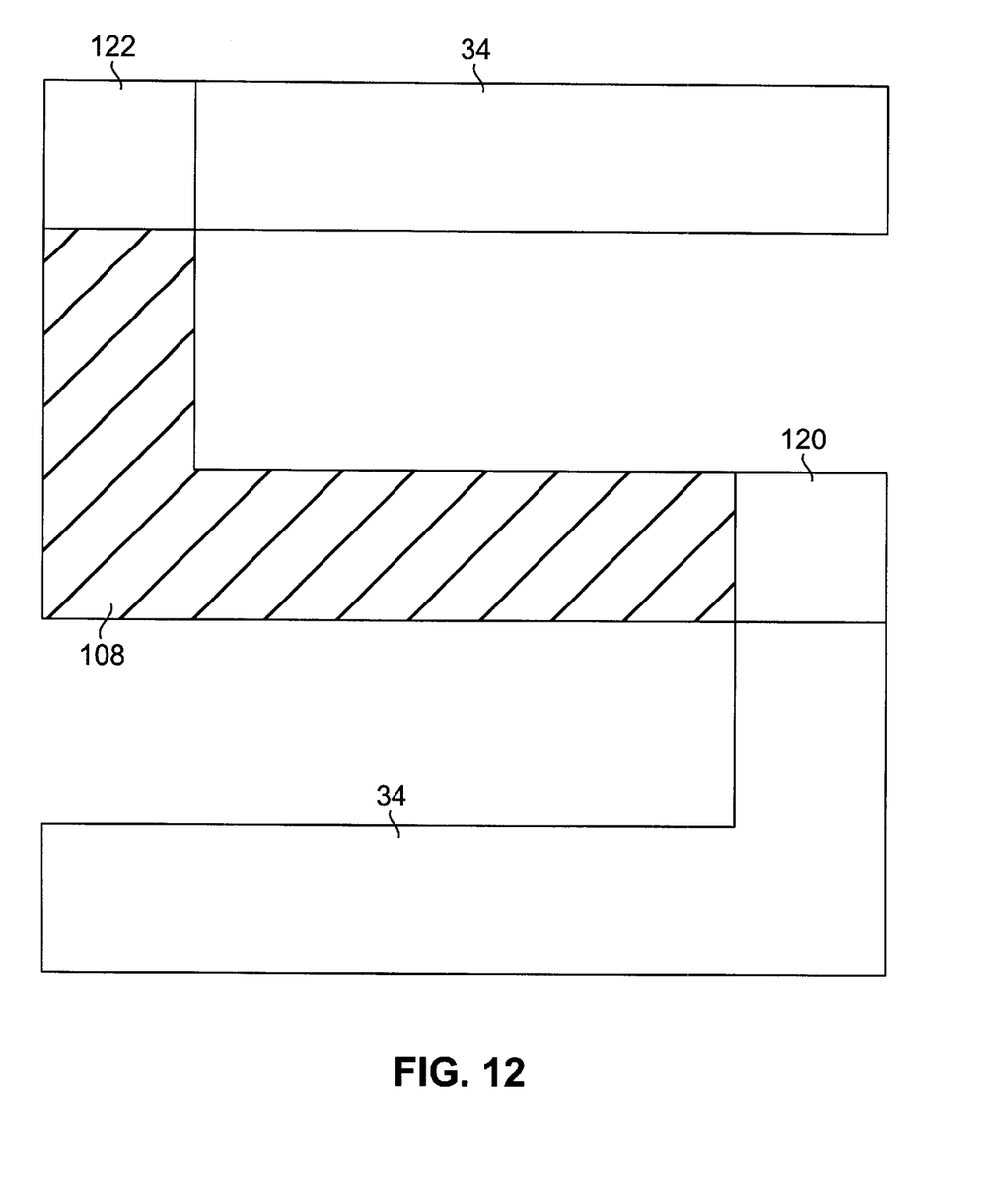

In the embodiment of FIG. 12, the metal-1 runner 34 is L-shaped, with the short leg extending rearwardly to contact the metal-3 runner 108, by way of a vertical conductive stack 120, comprising the conductive via 66, the metal-2 via layer 68, the conductive via 107 and the metal-3 via layer 109. The metal-3 runner 108 is also L-shaped as shown, having a short leg electrically connected to the adjacent metal-1 runner 34 via an electrically conductive stack 122, comprising the conductive via 65, the metal-2 via layer 67, the conductive via 106 and the metal-3 via layer 108.

Although the Figures and accompanying description herein illustrate placement of the bottom and top metal layers of the inductor in the metal-1 and metal-3 layers of the integrated circuit, the inventive features of the present invention can be applied such that the inductor spans other metal layers, for example, the bottom segment of the winding can be placed within the metal-2 layer and the top segment of the winding can be placed within the metal-4 layer or the metal-5 layer. Other embodiments where different metal layers and a different number of metal layers are spanned are considered within the scope of the present invention. Further, although in one embodiment, the inductor according to the present invention is formed using the damascene process, the invention is not limited to the use of this technique.

Although formation of the inductor according to the present invention has been described using a damascene process, the invention is not limited thereto. The inductor can also be formed using conventional metal deposition and etch steps wherein the metal layers forming the top and bottom winding segments are interconnected by vertical vias spanning at least three metal layers, i.e., at least one metal layer is not used to form either a top or a bottom winding segment.

Advantageously, the multi-layer inductor formed according to the teachings of the present invention is compatible with conventional CMOS backflow (i.e., interconnect) processing and does not require any additional masking steps during the process of fabricating the CMOS devices. Because the conductive structures are formed of copper, the resulting conductor has relatively lower resistance than those formed with aluminum and thus a higher Q. A larger inductor cross-sectional area results from the use of metal layers at different levels of the substrate (for example, metal-1 to metal-3 or metal-3 to metal-5) and produces a higher inductance value. As illustrated by the processing steps discussed above, the inductor is highly integratable either on-chip with other active elements or as part of a multi-module device constructed on a common substrate. The use of less conductive material in the inductor structure lowers the eddy current losses. Also, the magnetic circuit lines are more concentrated due to the compact inductor structure, and thus the inductance is increased and the effect on proximate regions of the integrated circuit is reduced.

An architecture and process have been described as useful for forming a thin film multi-layer high Q inductor on a semiconductor substrate. While specific applications of the invention have been illustrated, the principals disclosed herein provide a basis for practicing the invention in a variety of ways and in a variety of circuit structures. Numerous variations are possible within the scope of the invention, including the use of any two metal layers to form the inductor conductors. The invention is limited only by the claims that follow.

What is claimed is:

1. An integrated circuit inductor structure comprising:
   a semiconductor substrate having a plurality of insulating layers and a plurality of metallization layers therebetween;
   a plurality of first conductive strips disposed in a first metallization layer of said semiconductor substrate;
   a first stack of conductive vias in electrical connection with a first end of each one of the plurality of first conductive strips;
   a second stack of conductive vias in electrical connection with a second end of each one of the plurality of first conductive strips; and
   a plurality of second conductive strips disposed in a second metallization layer of said semiconductor substrate, wherein one of the plurality of second conductive strips spans and interconnects two consecutive first conductive strips through the first and the second stack of conductive vias, and wherein each one of the plurality of second conductive strips has a first end in electrical connection with an upper surface of the first stack of conductive vias and a second end in electrical connection with an upper surface of the second stack of conductive vias for interconnecting the two consecutive first conductive strips, wherein the plurality of second conductive strips are vertically spaced-apart from the plurality of first conductive strips with at least three intervening metallization layers therebetween.

2. A multi-level integrated circuit inductor structure, comprising:
   a semiconductor substrate having a plurality of insulating layers and a plurality of conductive layers therebetween, and further having a plurality of active devices formed therein;
   runner conductive portions including first and second terminal ends thereof, wherein each of the first and the second terminal ends is connected to one of the plurality of active devices;
   vertical conductive portions;
   wherein lower runner portions are formed in a lower conductive layer of the semiconductor substrate;
   wherein upper runner portions are formed at least two or more conductive layers above the lower runner portions;
   wherein two or more vertically aligned first via portions effect electrical connection between a first end of a first lower runner portion and an overlying first end of a first upper runner portion; and
   wherein two or more vertically aligned second via portions effect electrical connection between a first end of a second lower runner portion and an overlying second end of the first upper runner portion.

\* \* \* \* \*